United States Patent [19]

Sayka

[11] Patent Number: 5,472,825
[45] Date of Patent: * Dec. 5, 1995

[54] METAL INTERCONNECT FABRICATION WITH DUAL PLASMA SILICON DIOXIDE DEPOSITION AND ETCHBACK

[75] Inventor: Anthony Sayka, San Antonio, Tex.

[73] Assignee: VLSI Technology Inc., San Jose, Calif.

[ * ] Notice: The portion of the term of this patent subsequent to May 10, 1994, has been disclaimed.

[21] Appl. No.: 126,469

[22] Filed: Sep. 24, 1993

[51] Int. Cl.$^6$ ........................................ G03F 7/00
[52] U.S. Cl. .......................... 430/311; 430/322; 430/323; 430/327; 430/313
[58] Field of Search ................................ 430/311, 313, 430/314, 320, 322, 323, 327

[56] References Cited

U.S. PATENT DOCUMENTS 4,176,003  11/1979  Brower et al. ........................... 430/313
5,310,621   5/1994  Sayka ...................................... 430/311

OTHER PUBLICATIONS

A. Sayka & J. G. Eberhart, "The Effect of Plasma Treatment on the Wettability of Substrate Materials", *Solid State Technology*, May, 1969, pp. 69–70.

Primary Examiner—Kathleen Duda
Attorney, Agent, or Firm—Clifton L. Anderson

[57] ABSTRACT

In the fabrication of an integrated circuit, an intermetal dielectric is formed using a plural plasma processes that can be performed without having to transfer the wafer in the interim. This saves on wafer handling. A wafer with a patterned first metal wafer is placed into a plasma chamber. A relatively low-power noble gas plasma is applied to clean the wafer. A reactive plasma treatment is then used to deposit silicon dioxide to a thickness greater than ultimately desired. A noble gas plasma is used to etch back the silicon dioxide. Spin-on glass is then applied. The previous etch back aids the conformance of the spin-on glass to the underlying structure. The spin-on glass can be polished for further planarization. A second silicon dioxide layer can be deposited on top of the spin-on glass. Via apertures can be photolithographically defined through the three-layer dielectric. Finally, second layer metal is deposited and patterned. The method provides for high wafer throughput, while minimizing voids at the interface between the spin-on glass and the underlying silicon dioxide layer.

5 Claims, 5 Drawing Sheets

METAL INTERCONNECT FABRICATION WITH DUAL PLASMA SILICON DIOXIDE DEPOSITION AND ETCHBACK

BACKGROUND OF THE INVENTION

The present invention relates to semiconductor processing and, more particularly, to fabrication of a metal interconnect structure for an integrated circuit. A major objective of the present invention is to minimize voids between a spin-on glass and an underlying silicon dioxide layer.

Much of modern technological progress is identified with miniaturization of integrated circuits. Miniaturization allows for increased functionality by increasing the number of circuits that can be integrated onto a single device. Increased processing speeds are also achieved as the capacitances and distances between circuit elements are reduced. In addition, miniaturization can lower costs by increasing the number of integrated circuit devices that can be made together.

Patterned metal interconnect layers are generally used to provide the "integration" of integrated circuits. Two or more metal layers are usually required to provide for non-shorting cross over of electrical connections. The metal layers are electrically isolated from each other by an intermetal dielectric; where intermetal connections are required, metal vias extend through the intermetal dielectric. The metal interconnect structure is, in turn, electrically isolated from the circuit elements below by a submetal dielectric; contact vias through the submetal dielectric provide access to the integrated circuit elements.

One of the challenges in building an integrated circuit up layer-by-layer is that significant nonplanarities arise. For example, after the first metal is patterned, the locations from which metal has been removed are lower than adjacent locations where metal remains. If these nonpanarities are carried through formation of the intermetal dielectric, problems can arise when the second metal is deposited. For example, the second metal can have difficulty conforming to the nonplanar contours; this can lead to electrical discontinuities, lower performance and shorter device lifetimes.

To improve the planarity for the second metal, a spin-on glass can be used in the intermetal dielectric. A spin-on glass is applied as a liquid, which fills in the troughs, while maintaining a relatively planar upper surface. The liquid is viscous, so there is some conformity to large scale nonplanarities. The spin-on glass is polymerized. Further planarization can be achieved by polishing and/or etchback.

One problem with spin-on glass is that it contains moisture and other solvents that can attack adjacent metal layers. This problem can be addressed by sandwiching the spin-on glass between deposited silicon dioxide layers.

While it provides a planar surface for overlaying layers, the spin-on glass itself is deposited on a non-planar surface. The spin-on glass may fail to conform to the underlying nonplanarities, leaving voids at the interface with the lower silicon dioxide layer. These voids can impair the dielectric character of the intermetal dielectric. In addition, the voids can serve as sites for moisture to accumulate and attack adjacent features, such as metal vias. Furthermore, the voids can serve as channels through which wet etches can reach unintended areas, impairing or destroying the integrated circuit.

What is needed is a method of applying spin-on glass that results in improved conformity to an underlying nonplanar silicon dioxide layer so that voids are minimized. Preferably, the method would minimally impact process complexity, integrated circuit handling, and fabrication throughput.

SUMMARY OF THE INVENTION

In accordance with the present invention, silicon dioxide is deposited using a plasma-enhanced chemical-vapor deposition to a thickness greater than the desired end thickness. The deposited oxide is then etched back to the desired end thickness using a noble-gas plasma etch. To minimize handling, the deposition and etch back can take place in the same plasma chamber.

More specifically, the method of the present invention begins with fabrication of an integrated circuit through patterning a first metal. The integrated circuit is then introduced into a plasma chamber. Optionally, a low-power noble-gas plasma treatment can be used to clean the wafer. Reactant gas is then introduced into the chamber. The reactant gases are ionized and react to form silicon dioxide. The silicon dioxide thus formed is deposited on the integrated circuit. The rf power used for the deposition plasma can be between 150 and 300 Watts, and the pressure in the chamber can be at least 1 Torr and less than 3 Torr.

After the chamber is purged, noble gas can be introduced into the chamber, preferably at a pressure between 0.1 and 0.2 Torr. This noble gas is ionized, preferably with an rf power between 150 and 250 Watts. This noble gas plasma is applied until the silicon dioxide is etch back to a desired thickness.

The integrated circuit can be removed from the chamber. Spin-on glass is applied as the wafer is spinning. Spinning continues until the spin-on glass is evenly spread over the wafer. A hot bake can follow to remove solvents. After polymerization, the result is nearly 100% silicon dioxide. Application of the spin-on glass includes spinning the integrated circuit to spread the viscous spin-on glass uniformly. The spin-on glass is then polymerized. Preferably, the spin-on glass is polished to further enhance planarity.

Silicon dioxide is deposited over the spin-on glass. Vias apertures are photolithographically defined through the resulting intermetal dielectric. A second metal is deposited, filling the via apertures to define metal vias. The second metal is photolithographically patterned to complete the metal interconnect structure.

Surprisingly, voids between the spin-on glass and the underlying silicon dioxide are generally fewer when the silicon dioxide is deposited to excess and etched back than when the silicon dioxide is simply deposited to the desired thickness. By way of explanation, and not of limitation, it may be that the rough etched surface disrupts the surface tension of the viscous spin-on glass as it is applied. Breaking the surface tension improves conformity, and thus reduces voids.

Since the plasma cleaning, the PECVD oxide deposition and the etch back are plasma processes, they can be performed in a single chamber. Thus, no additional integrated circuit handling steps are required by the present invention. Thus integrated circuit integrity is enhanced without substantially impairing processing throughput or increasing exposure to contaminants. As a result of the etch back, the spin-on glass exhibits greater conformity to the underlying layer and a reduction in the occurence of voids. Furthermore, the invention can be used to improve spin-on glass conformity to a nonplanar lower layer in contexts other than an intermetal dielectric. These and other features and advantages of the present invention are apparent from the description below with reference to the following drawings.

Figure 1:
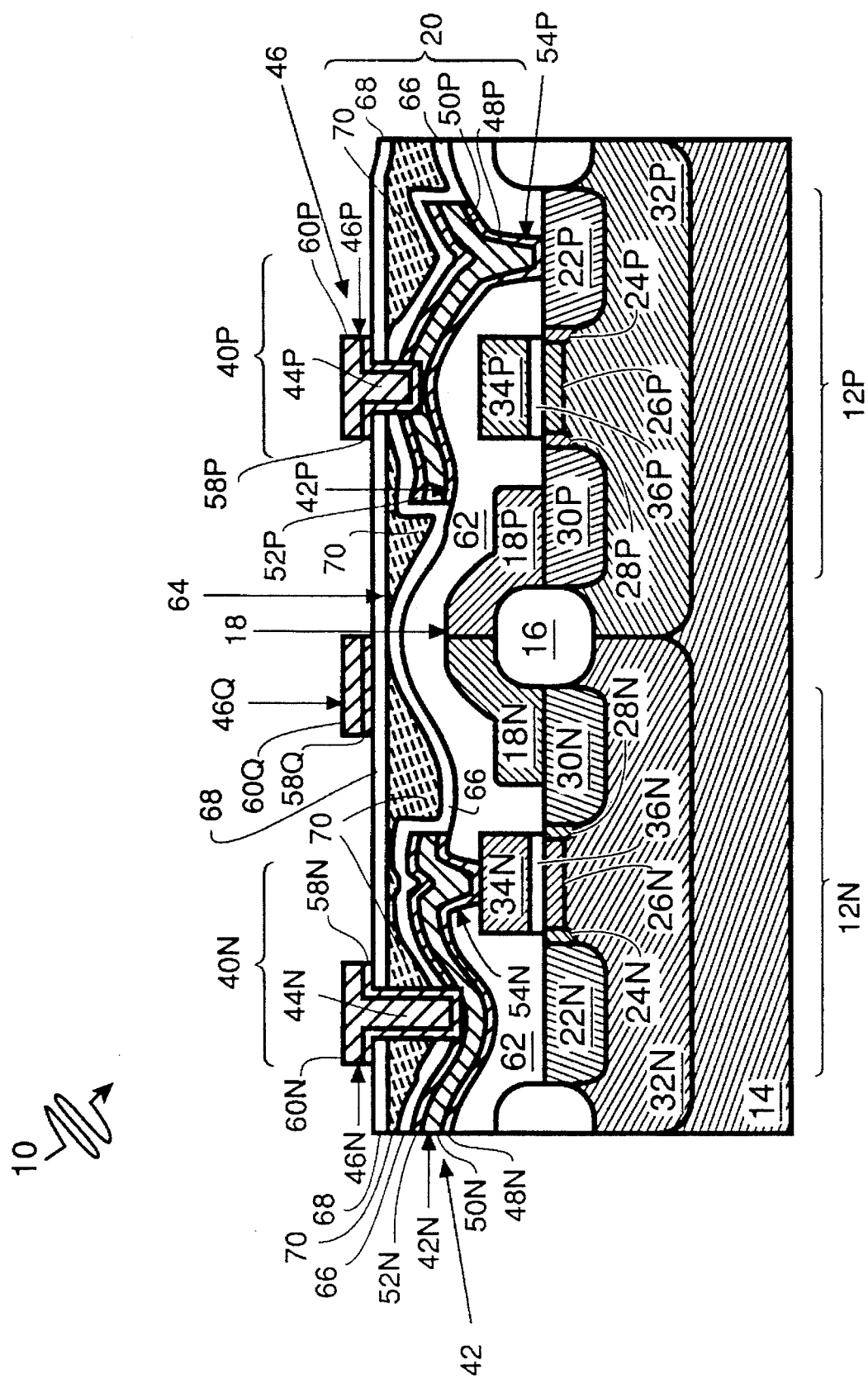
FIG. 1 is an integrated circuit fabricated in accordance with the present invention.

In the drawings, the hatching of the monocrystalline and polycrystalline silicon roughly indicates doping type and concentration. P-type doping is represented by a positive slope and n-type doping is represented by a negative slope. The steepness of the slope roughly correlates with doping concentration. This convention is applied only to semiconductor materials; hatching of conductive and dielectric materials does not indicate conductivity. The hatching for conductors is thicker and more widely spaced than that used for silicon. Spin-on glass is indicated by broken hatching; other dielectrics are not hatched. Substrates and wells are omitted from FIGS. 3 et seq.

DESCRIPTION OF THE PREFERRED EMBODIMENT

Figure 2:
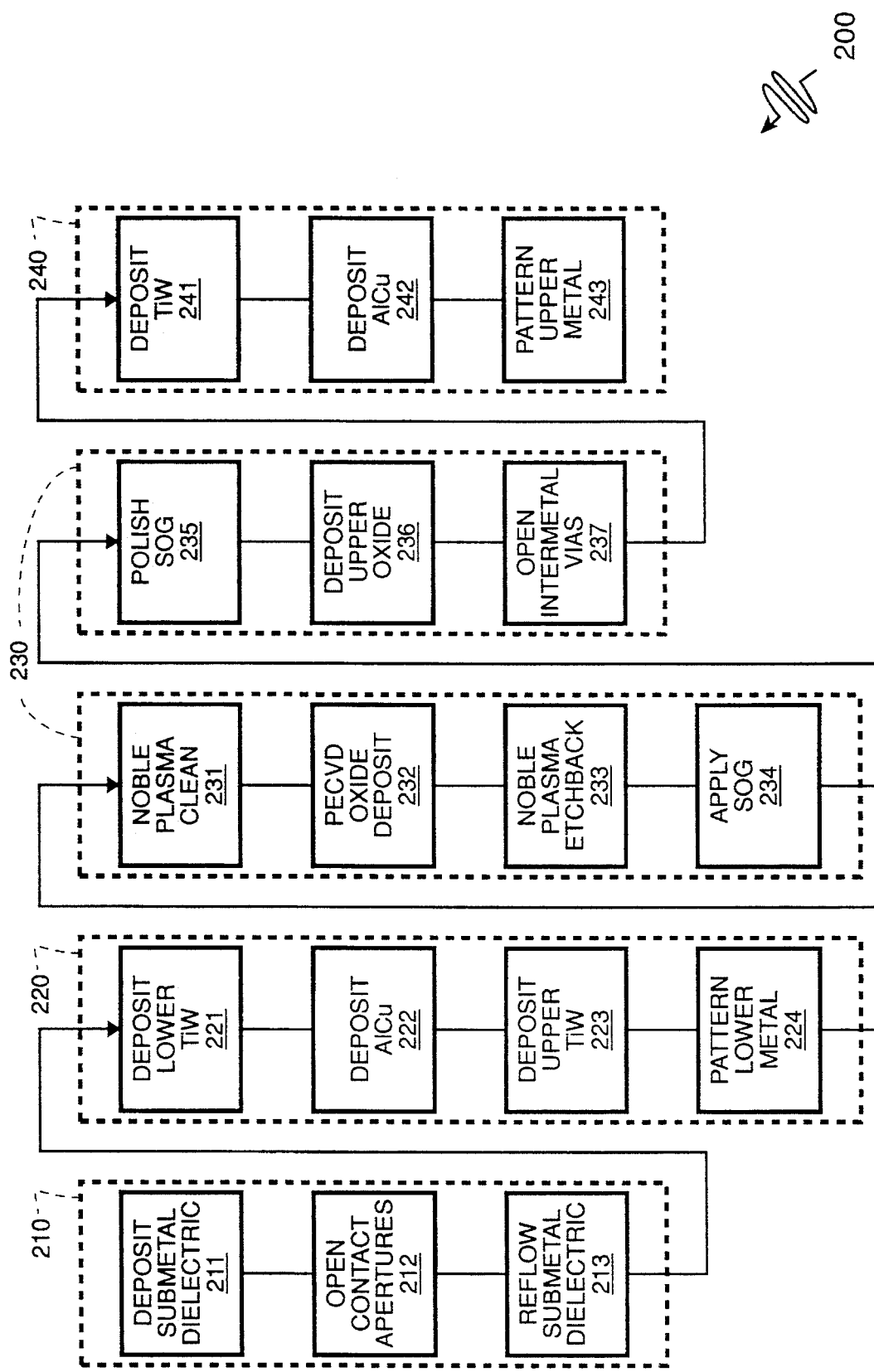
FIG. 2 is a flow chart of the method of the present invention.

A CMOS integrated circuit 10, illustrated in FIG. 1, is fabricated in accordance with the present invention as embodied in a method 200, flow charted in FIG. 2. CMOS integrated circuit 10 includes an n-channel transistor 12N and a p-channel transistor 12P formed in and on a lightly doped n-type crystalline silicon substrate 14. Transistors 12N and 12P are electrically isolated from each other and other devices of CMOS integrated circuit 10 by a field oxide 16. Transistors 12N and 12P are coupled to each other by a local interconnect 18 to define an inverter. Transistors 12N and 12P are coupled to other devices of CMOS integrated circuit 10 by metal interconnect structure 20.

N-channel transistor 12N includes a heavily doped p-type source 22N, a lightly doped p-type source 24N, an n-channel 26N, a lightly doped p-type drain 28N and a heavily doped p-type drain 30N, all formed in an n-well 32N. The conductivity through n-channel 26N is controlled by the voltage at a gate 34N of heavily doped n-type polysilicon. Gate 34N is electrically isolated from n-channel 26N by gate oxide 36N.

P-channel transistor 12P includes a heavily doped n-type source 22P, a lightly doped n-type source 24P, a p-channel 26P, a lightly doped n-type drain 28P and a heavily doped n-type drain 30P, all formed in a p-well 32P. The conductivity through p-channel 26P is controlled by the voltage at a gate 34P of heavily doped p-type polysilicon. Gate 34P is electrically isolated from p-channel 26P by gate oxide 36P.

Metal interconnect structure 20 provides electrical access to active components of CMOS integrated circuit 10. FIG. I shows an access structure 40N for gate 34N of n-channel transistor 12N and an access structure 40P for source 22P of p-channel transistor 12P. Metal interconnect structure 20 also provides access to source 22N and to gate 34P, but these are not in the plane of FIG. 1. Metal interconnect structure 20 does not provide access to drains 30N and 30P as these are coupled in an inverter arrangement by polysilicon local interconnect 18, as indicated above.

Access structure 40N includes a lower metalization 42N and an upper metalization 46N, electrically coupled to each other and to gate 34N. Lower metalization 42N includes a titanium tungsten (TiW) etch stop 48N, an aluminum copper (AlCu) lower conductor 50N, and another TiW etch stop 52N. A metal contact 54N to emitter 34N is integral with lower metalization 42N. Upper metalization 46N includes a TiW etch stop 58N and an AlCu conductor 60N. A metal via 44N is integral with upper metalization 46N.

Access structure 40P includes a lower metalization 42P and an upper metalization 46P, electrically coupled to each other and to source 22P. Lower metalization 42P includes a TiW etch stop 48P, an AlCu lower conductor 50P, and another TiW etch stop 52P. A metal contact 54P to source 22P is integral with lower metalization 42P. Upper metalization 46P includes a TiW etch stop 58P and an AlCu conductor 60P. A metal via 44P is integral with upper metalization 46P.

Metal interconnect structure 20 is electrically isolated generally from devices of integrated circuit 10 by submetal dielectric 62. An intermetal dielectric structure 64 provides for electrical isolation between access structures of integrated circuit 10, including access structures 40N and 40P. Intermetal dielectric structure 64 includes a lower oxide 66 and an upper oxide 68 sandwiching pockets of spin-on glass 70. Metal components are protected from moisture of spin-on glass 70 by lower oxide 66 and upper oxide 68.

Between access structures 40P and 40N is an interconnect line 46Q not connected to either transistor 12N or 12P. Interconnect line 46Q includes a TiW etch stop 58Q and an AlCu conductor 60Q. A patterned upper metal layer 46 includes interconnect line 46Q and upper metalizations 46N and 46P. A patterned lower metal layer 42 includes lower metalizations 42P and 42N.

Figure 3:
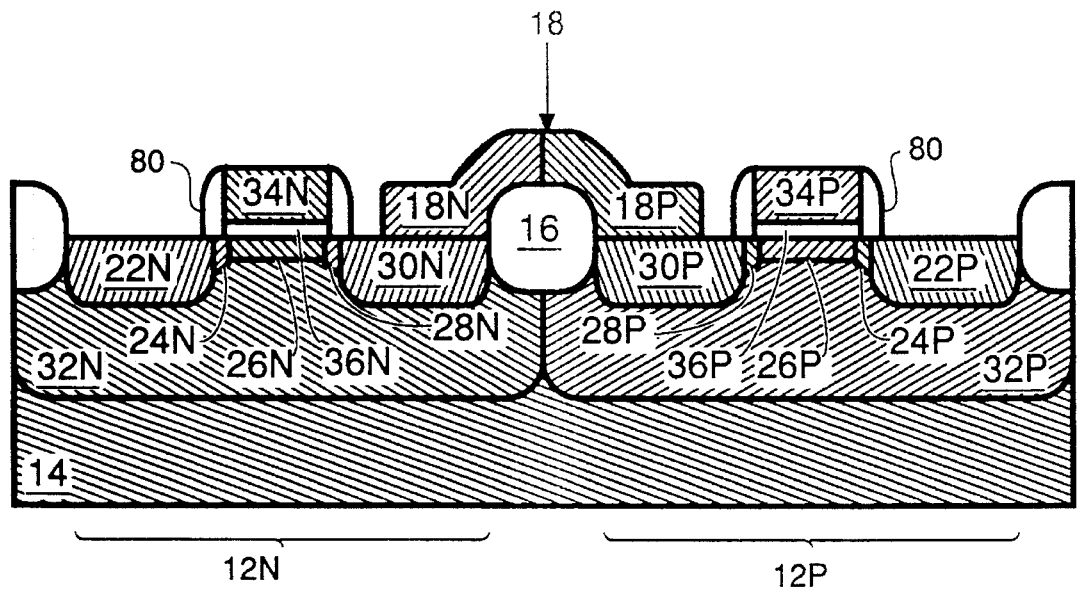
FIGS. 3–10 show various stages in the fabrication of integrated circuit of FIG. I in accordance with the method of FIG. 2.

A method 200 of the present invention provides for fabrication of CMOS integrated circuit 10 as flow charted in FIG. 2. The starting point for method 200, illustrated in FIG. 3, is basically as in FIG. 1 less metal interconnect structure 20 and submetal dielectric 62. The structure of FIG. 3 is conventional, so those skilled in art can determine methods for fabricating it.

Sidewall spacers 80 are grown on gates 34N and 34P after the dopants for lightly doped sources and drains 24N, 24P, 28N, and 28P are implanted and before the dopants for heavily doped sources and drains 22N, 22P, 30N, and 30P are implanted so that the latter are separated from respective channels 26N and 26P.

Local interconnect 18 includes heavily doped n-type section 18N and heavily doped p-type section 18P. The alternate doping is an artifact of a "split-poly" methodology that has the undesirable side effect of defining a diode junction at the mutual boundary. Accordingly, local interconnect 18 is capped with a tungsten silicide formation, not separately shown, to short this junction.

Figure 4:
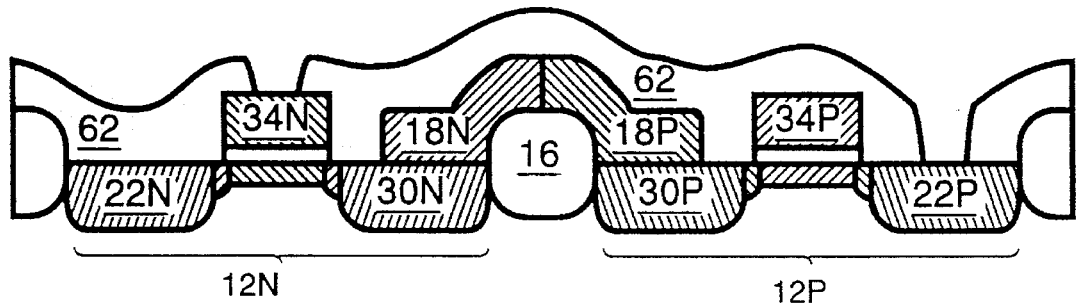

Submetal dielectric stage 210 of method 200 provides for submetal dielectric 62. In a step 211, submetal dielectric 62, shown in FIG. 4, is deposited. Submetal dielectric 62 is silicon dioxide doped with boron and phosphorous to enhance its flow characteristics. It can be deposited using a doped tetraethylorthosilicate (TEOS) chemical vapor deposition (CVD). Sidewalls 80 are for all practical purposes merged with submetal dielectric 62 and so are not separately indicated other than in FIG. 3.

After submetal dielectric 62 is deposited, contact apertures are photolithographically defined, at step 212, to provide contact access to circuit devices. As indicated in FIG. 4, contact apertures are opened over gate 28N and source 32P. Contact apertures are also formed over gate 28P and source 32N, but these are out of the plane of FIG. 4.

After the contact apertures are formed, the structure is heated to 875° C. to reflow submetal dielectric 62 at step 213. The original sharp edges of the contact apertures soften to provide a gently sloping contact aperture sidewall. In addition, some planarization occurs across submetal dielectric 62. The planarization facilitates subsequent depositions. The contact-aperture softening facilitates contact metal coverage within the contact aperture. It is noted that this reflow technique is not available for via apertures through intermetal dielectric structure 64 since the heat required for reflow would melt previously deposited metals. The structure resulting from steps 211–213 of stage 210 is shown in FIG. 4.

Figure 5:
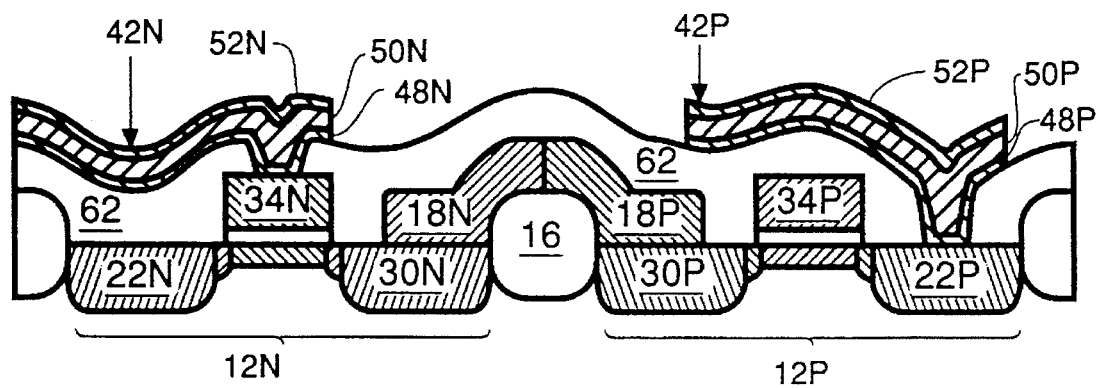

Lower metal stage 220 provides for etch stop and conductor depositions. A lower etch stop deposition, at step 221, provides the TiW of etch stops 48N and 48P. In a conductor deposition step 222, aluminum copper alloy (AlCu) is sputtered to form a layer that, upon patterning, provides the material for lower conductors 50N and 50P. At step 223, TiW is sputtered again to provide the material for etch stops 52N and 52P. The etch stop structures 52N and 52P enhance the high temperature characteristics of lower metal structures 42N and 42P. The resulting multilayer structure is photolithographically patterned at step 224 to yield the structure of FIG. 5, completing stage 220.

Intermetal dielectric stage 230 provides for intermetal dielectric structure 64, shown in FIG. 1. The first three steps are performed in a single plasma chamber, minimizing wafer handling and enhancing fabrication throughput. A cleaning step 231 uses a relatively low power plasma to remove contaminants from the exposed TiW and silicon dioxide surfaces of the structure of FIG. 5. An argon plasma is conducted at an rf power of 120 Watts and a gas pressure of 500 mTorr for 10 minutes. Other plasmas can be used for cleaning, but the gas is preferably a noble gas such as helium or argon to minimize chemical reactions. The power should be low enough to avoid substantial etching of the exposed surfaces so that the cleaning time can be at least several minutes to ensure thorough contaminant removal. The exact power is a function of the pressure, the selected gas, and other factors as is known to those skilled in the art.

A plasma-enhanced chemical vapor deposition (PECVD) of silicon dioxide is performed at step 232. The argon gas is purged, and the pressure is adjusted to 2.25±0.25 Torr and temperature is set at 430° C.±10° C. The rf power is between 200 and 300 Watts, preferably about 250 Watts. Silane (SiH$_4$) is introduced into the plasma chamber at a rate of 80±8 sccm, while nitrous oxide (N$_2$O) is introduced at a rate of 1000±100 sccm. Plasma conditions are maintained for 10±0.3 seconds to provide a silicon dioxide thickness of 2700 Å for lower oxide 66. If wafers are batch processed, they should be spaced about 400 mil apart. A nitrogen purge follows. The resulting thickness is 200 Å thicker than the desired 2500 Å for the lower oxide, as indicated by desired level markers 90 in FIG. 6.

Figure 6:
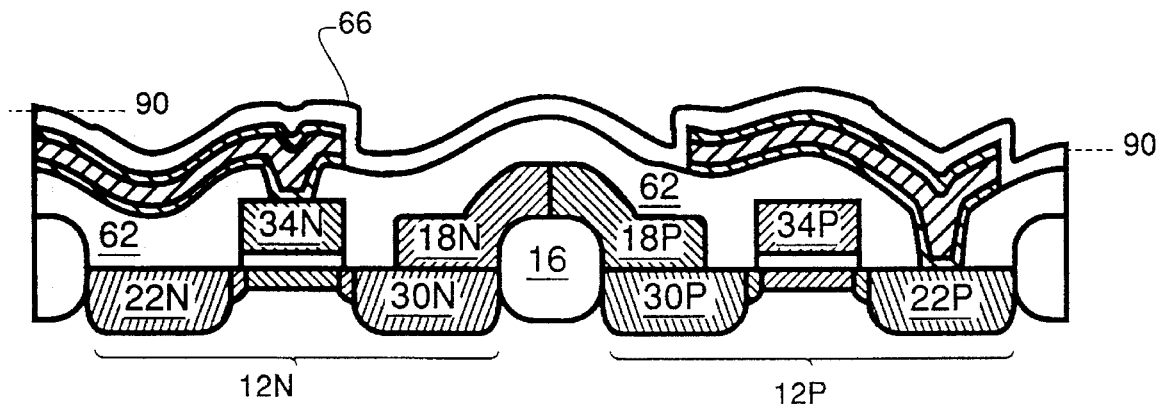
Figure 7:
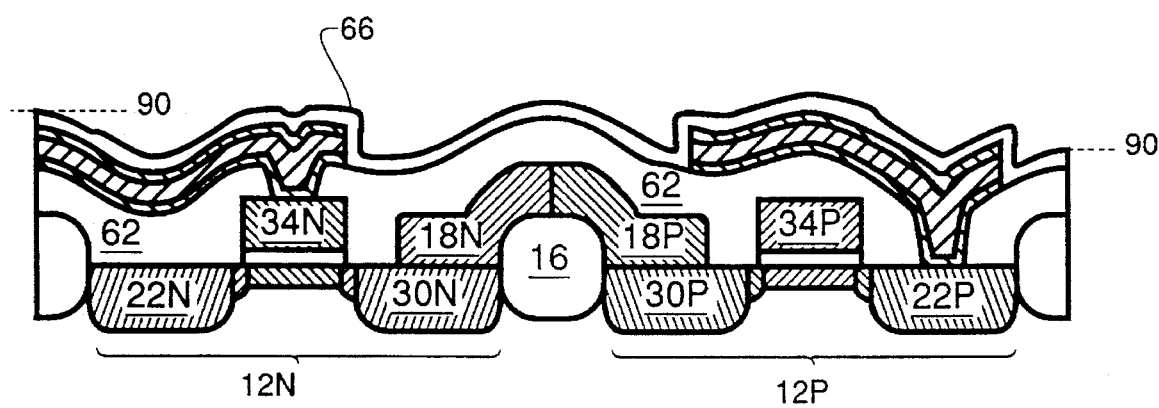

The silicon dioxide layer of FIG. 6 is etched back using a relatively high power and low pressure noble-gas etch in step 233. Argon is introduced into the chamber at a rate between about 80 sccm and 125 sccm so as to establish a pressure between 100 mTorr and 200 mTorr within the plasma chamber. Preferably, the flow rate is about 100 sccm and the pressure is about 150 mTorr. The rf electric power used to establish the plasma is between about 150 Watts and 250 Watts, and preferably about 200 Watts. The time is selected to achieve the desired degree of etch back. The plasma can be applied for three minutes to remove 200 Å. The time can be shorter if a minimal etch back is desired. The structure resulting from step 233 is shown in FIG. 7. As indicated the silicon dioxide level matches markers 90.

Figure 8:
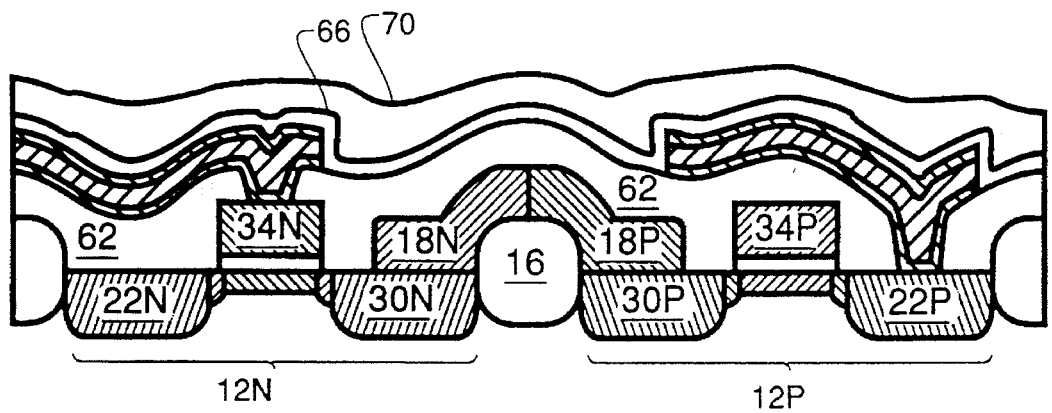

Spin-on glass is applied at step 234. The application is followed by a hot bake. The hot bake can involve three stages: a bake at 80° C., and two at 230° C. A silanol monomer formulation is spun on the structure of FIG. 7. The formulation is thermally polymerized and baked to remove most of the water and other solvents in the monomer formulation. The resulting spin-on glass 70 tends to planarize the underlying structure, as indicated in FIG. 8. In practice, the spin-on glass can be applied twice to achieve a total dielectric thickness of 8000 Å.

Figure 9:
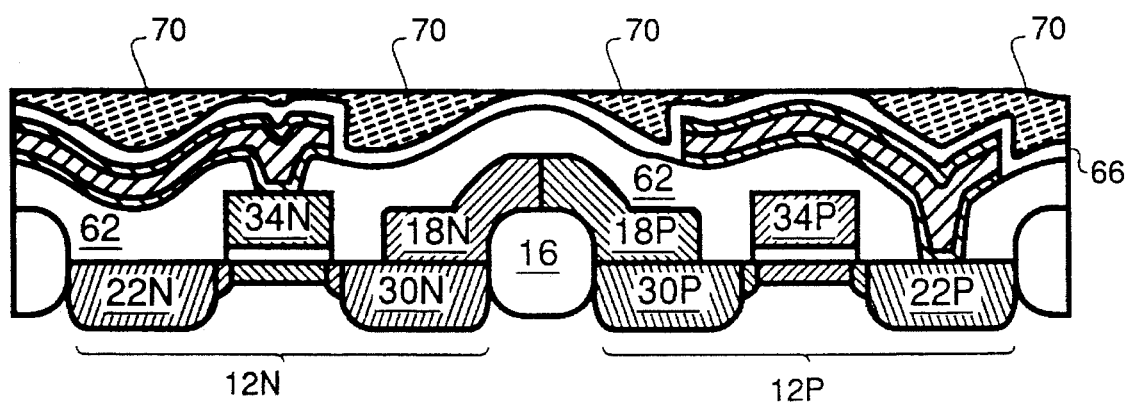

The structure of FIG. 8 is then polished at step 235. Polishing is continued until either uniform planarization is accomplished, or a minimum dielectric thickness is reached locally. The structure resulting from step 235 is shown in FIG. 9. Alternatively, the structure of FIG. 8 can be polished until some silicon dioxide is exposed, leaving islands of spin-on glass to fill in depressions. This etch tends to remove all or most spin-on glass over the underlying metal pattern to which vias will connect. In this way, via poisoning by the spin-on glass can be minimized. The target dielectric thickness after etchback is 1425 to 2850 Å.

Figure 10:
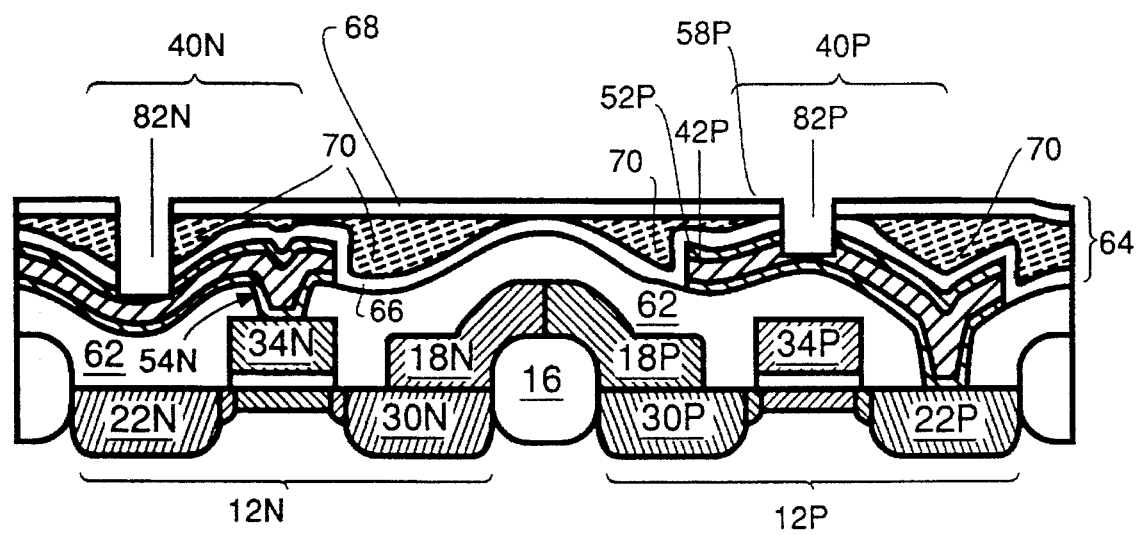

A PECVD silicon dioxide deposition is performed at step 236 to provide upper oxide 68, which is 5000Å thick. This PECVD can be performed in the manner of step 232. A plasma clean step can serve as preparation for step 236. Intermetal via apertures 82N and 82P are photolithographically defined at step 237, completing intermetal dielectric stage 230. FIG. 10 shows the result of stage 230.

Upper metal stage 240 provides upper metalizations 46N, 46P, and 46Q. TiW is deposited at step 241. AlCu is deposited at step 242. In both steps 241 and 242, the deposited material partially fills the via apertures defined at step 238. The resulting two-layer metalization is patterned at step 243 to define upper metalization 46N, 46P, and 46Q. The result is shown in FIG. 1. Additional intermetal dielectrics and metalization layers can be added using method 200, stages 210 to 240. The final structure can be passivated using additional silicon dioxide and/or silicon nitride layers.

The present invention applies to minimizing voids in other contexts where a spin-on glass is applied to a nonplanar surface. These and other modifications to and variations upon the preferred embodiments are provided for by the present invention, the scope of which is limited only by the following claims.

What is claimed is:

1. A method for forming a metal interconnect structure for an integrated circuit, said method comprising the steps of:

fabricating an integrated circuit up to and including a substep of patterning a first metal;

introducing said integrated circuit into a plasma chamber;

introducing oxygen-bearing gas into said chamber;

ionizing said oxygen-bearing gas so that silicon dioxide is deposited on said integrated circuit;

introducing noble gas into said chamber;

ionizing said noble gas so that said silicon dioxide is etched back;

removing said integrated circuit from said plasma chamber;

applying spin-on glass to said integrated circuit;

depositing silicon dioxide on said spin-on glass;

photolithographically defining vias to said first metal;

depositing a second metal; and patterning said second metal.

2. A method as recited in claim 1 further comprising polishing said integrated circuit after said spin-on glass is applied and before said silicon dioxide is deposited on said spin-on glass.

3. A method as recited in claim 1 wherein, in said step of ionizing said noble gas, radio frequency energy characterized by a power between 150 watts and 250 watts is used to effect the ionization.

4. A method as recited in claim 3 wherein, in said step of ionizing said noble gas, said plasma chamber is under a pressure between 0.1 Torr and 0.2 Torr.

5. A method for forming a metal interconnect structure for an integrated circuit, said method comprising the steps of:

fabricating an integrated circuit through patterning a first metal;

introducing said integrated circuit into a plasma chamber;

introducing reactant gases into said chamber;

ionizing said reactant gases at an rf power of 150–300 watts and a pressure of less than 3 Torr so that silicon dioxide is deposited on said integrated circuit;

introducing noble gas into said chamber;

ionizing said noble gas at an rf power of 150 to 250 watts and a pressure of 0.1 to 0.2 Torr so that said silicon dioxide is etched back;

removing said integrated circuit from said plasma chamber;

applying spin-on glass on said integrated circuit;

polymerizing said spin-on glass;

depositing silicon dioxide on said spin-on glass;

photolithographically defining vias to said first metal;

depositing a second metal; and patterning said second metal.

* * * * *